US008829692B2

(12) United States Patent  
Rajashekara et al.

(10) Patent No.: US 8,829,692 B2  
(45) Date of Patent: Sep. 9, 2014

(54) MULTILAYER PACKAGED SEMICONDUCTOR DEVICE AND METHOD OF PACKAGING

(75) Inventors: Kaushik Rajashekara, Carmel, IN (US); Ruxi Wang, Blacksburg, VA (US); Zheng Chen, Blacksburg, VA (US); Dushan Boroyevich, Blacksburg, VA (US)

(73) Assignee: Rolls-Royce Corporation, Indianapolis, IN (US)

( * ) Notice: Subject to any disclaimer, the term of this patent is extended or adjusted under 35 U.S.C. 154(b) by 8 days.

(21) Appl. No.: 13/603,377

(22) Filed: Sep. 4, 2012

(65) Prior Publication Data

US 2014/0061879 A1   Mar. 6, 2014

(51) Int. Cl.  
*H01L 23/053*   (2006.01)  
*H01L 23/48*    (2006.01)

(52) U.S. Cl.  
USPC ........... 257/784; 257/700; 257/723; 257/698; 257/E23.043

(58) Field of Classification Search  
USPC ................. 257/698, 700, 707, 723, 724, 784, 257/E23.043  
See application file for complete search history.

(56) References Cited

U.S. PATENT DOCUMENTS

| | | | |
|---|---|---|---|
| 5,491,362 A * | 2/1996 | Hamzehdoost et al. | 257/712 |
| 5,518,684 A | 5/1996 | Pruitt | |
| 5,583,378 A * | 12/1996 | Marrs et al. | 257/710 |
| 5,767,573 A * | 6/1998 | Noda et al. | 257/675 |
| 5,801,073 A | 9/1998 | Robbins et al. | |
| 5,834,840 A | 11/1998 | Robbins et al. | |
| 6,150,726 A | 11/2000 | Feilchenfeld et al. | |
| 6,228,468 B1 | 5/2001 | Vodrahalli | |
| 6,555,052 B2 | 4/2003 | Soga et al. | |
| 6,774,490 B2 | 8/2004 | Soga et al. | |
| 6,882,047 B2 * | 4/2005 | Hata et al. | 257/734 |
| 7,514,780 B2 * | 4/2009 | Sakamoto et al. | 257/700 |
| 7,884,488 B2 | 2/2011 | Hedler | |
| 8,008,758 B1 | 8/2011 | Kim et al. | |
| 8,018,034 B2 | 9/2011 | Chi et al. | |
| 8,472,196 B2 * | 6/2013 | Zeng et al. | 361/718 |
| 8,488,316 B2 * | 7/2013 | Zeng et al. | 361/690 |
| 2004/0135248 A1 * | 7/2004 | Takagawa et al. | 257/724 |
| 2010/0140786 A1 * | 6/2010 | Lee et al. | 257/693 |
| 2010/0230790 A1 * | 9/2010 | Disney | 257/666 |
| 2012/0146211 A1 * | 6/2012 | Shiraishi et al. | 257/723 |

OTHER PUBLICATIONS

Kolar, et al., PWM Converter Power Density Barriers, Apr. 2007, pp. 9-29, Power Conversion Conference (PCC), Nagoya.

Boroyevich, et al., High-Density System Integration for Medium Power Applications, CIPS 2010, 6th International Conference on Integrated Power Electronics Systems.

Rebbereh, et al., First Inverter Using Silicon Carbide Power Switches Only, 9th Eur. Conf. Power Electron. Appl. (EPE 2003), Toulouse, France.

(Continued)

*Primary Examiner* — Nitin Parekh (74) *Attorney, Agent, or Firm* — Krieg DeVault LLP (57) ABSTRACT

One embodiment is a packaged device having multiple layers. Another embodiment is a method of forming a packaged device having multiple layers. Conductive layers and insulating layers can be formed with openings exposing semiconductor devices. The semiconductor devices can be wire-bonded to the conductive layers. In some embodiments, parasitic effects and a relative footprint of the packaged device can be reduced.

10 Claims, 3 Drawing Sheets

(56) References Cited

OTHER PUBLICATIONS

Chang, et al., Demonstration of Silicon Car-bide (SiC)-Based Motor Drive, Proc. IEEE Ind. Electron. Soc. (IECON 2003), vol. 2, pp. 1116-1121.

Hornberger, et al., The Application of Silicon-Carbide (SiC) Semiconductor Power Electronics to Extreme High-Temperature Extraterrestrial Environments, Proc. IEEE Int. Aerospace Conference 2004, Mar. 2004.

Sano, et al., Ultra-small Compact Transfer Molded Package for Power Modules, Proc. IEEE ECTC 2008, pp. 1832-1837.

Ning, et al., SiC Wirebond Multichip Phase-Leg Module Packaging Design and Testing for Harsh Environment, Power Electronics, IEEE Transactions on vol. 25, Issue: 1 2010.

Liang, et al., An Advanced Packaging Approach of SiC High Temperature Power Electronics Modules by Embedding Chip Interconnection, Proc. IMPAS HiTEC 2006, May 2006, pp. 101-107.

Ning, et al., A Novel High-Temperature Planar Package for SiC Multi-Chip Phase-Leg Power Module, Applied Power Electronics Conference and Exposition, 2009, APEC 2009, Twenty-Fourth Annual.

Wang, et al., Design of High-Temperature SiC Three-Phase AC-DC Converter for >100 Degrees Celcius Ambient Temperature, Energy Conversion Congress and Exposition (ECCE), 2010 IEEE.

\* cited by examiner

MULTILAYER PACKAGED SEMICONDUCTOR DEVICE AND METHOD OF PACKAGING

FIELD OF THE INVENTION

The present invention relates to packaged semiconductor devices and packaging methods and, in particular to packaged semiconductor devices and packaging methods with multiple layers.

BACKGROUND

Semiconductor packaging methods and systems that effectively package the semiconductor device with a desirable footprint and acceptable parasitic losses, as well as operate at potentially higher temperatures than conventional packaging methods and systems remain an area of interest. Some existing methods and systems have various shortcomings, drawbacks, and disadvantages relative to certain applications. Accordingly, there remains a need for further contributions in this area of technology.

SUMMARY

A packaged device and method of forming a packaged device having multiple layers. Conductive layers and insulating layers can be formed with openings exposing semiconductor devices. The semiconductor devices can be wire-bonded to the conductive layers. In some embodiments, parasitic effects and a relative footprint of the packaged device can be reduced.

BRIEF DESCRIPTION OF THE DRAWINGS

The description herein makes reference to the accompanying drawings wherein like reference numerals refer to like parts throughout the several views, and wherein.

DETAILED DESCRIPTION

For purposes of promoting an understanding of the principles of the invention, reference will now be made to the embodiments illustrated in the drawings, and specific language will be used to describe the same. It will nonetheless be understood that no limitation of the scope of the invention is intended by the illustration and description of certain embodiments of the invention. In addition, any alterations and/or modifications of the illustrated and/or described embodiment(s) are contemplated as being within the scope of the present invention. Further, any other applications of the principles of the invention, as illustrated and/or described herein, as would normally occur to one skilled in the art to which the invention pertains, are contemplated as being within the scope of the present invention. Moreover, it will be understood that other embodiments may include components and systems not illustrated or described herein, or may include fewer components and systems than those illustrated and described herein.

Semiconductor devices can be packaged using a variety of techniques. For example, double-sided semiconductor devices, such as double-sided semiconductor dies, can be mounted on a patterned conductive layer. Top pads of the semiconductor devices can be wire-bonded to portions of the patterned conductive layer. However, to reach different portions of the conductive layer, the bondwires can be relatively long, increasing parasitic inductance.

In another example, a planar packaging structure can include conductive layers that are sintered to the top pads of the semiconductor devices. Since the semiconductor devices can also be sintered to the conductive layer, multiple sintering compounds with different temperature profiles are used during multiple sintering processes. In addition, top pads of the semiconductor devices must be plated; however, such plating can easily separate, causing the device to fail.

FIGS. 1-7 are cross sectional views illustrating some aspects of a non-limiting example of techniques of packaging a device according to various embodiments of the present invention. In one form, a semiconductor packaging technique can be used for packaging semiconductor devices, such as high-temperature silicon carbide (SiC) devices. As will be described in further detail below, in some embodiments, the packaging technique can result in a footprint and parasitic effects similar to a planar structure, but without requiring double-side solderable devices. That is, semiconductor devices having topside metallization can, but need not be used. Moreover, material selection constraints due to planar structures are reduced, along with processing time and complexity.

Figure 1:
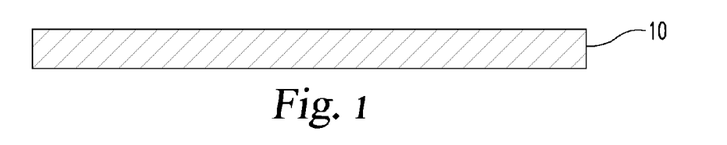
FIGS. 1-7 are cross sectional views illustrating some aspects of non-limiting examples of techniques of packaging a device according to various embodiments of the present invention.

Referring to FIG. 1, some aspects of a non-limiting example of a conductive layer 10 in accordance with an embodiment of the present invention are schematically illustrated. In one form, conductive layer 10 is a metal layer, such as copper. In other embodiments, other metallic and/or other materials may be employed in addition to or in place of copper. In one form, conductive layer 10 can be mounted to a substrate (not shown). For example, the conductive layer 10 can be a copper layer of a direct bonded copper (DBC) substrate. The substrate can be $Al_2O_3$, AlN, $Si_3N_4$, BeO, or the like. In a particular embodiment, the conductive layer 10 is a copper layer of an AlN DBC substrate. In other embodiments, other substrates may be employed in addition to or in place of those mentioned herein.

Although the conductive layer 10 is illustrated as continuous, the conductive layer 10 can be patterned. For example, the conductive layer 10 can be patterned to create electrical connections between various semiconductor devices, discrete components, package terminals, or the like. The conductive layer 10 can be patterned using any appropriate technique. For example, the conductive layer 10 can be etched after a masking process is performed. In some embodiments, conductive layer 10 may not be patterned.

Figure 2:
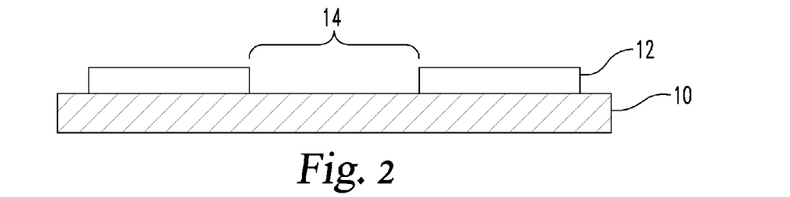

Referring to FIG. 2, some aspects of a non-limiting example of conductive layer 10 with an insulating layer 12 in accordance with an embodiment of the present invention are schematically illustrated. In one form, patterned insulating layer 12 is applied to the conductive layer 10. The patterned insulating layer 12 includes an opening 14 exposing the conductive layer 10. The opening 14 is a non-limiting example of one of many forms of openings which may be employed. In various embodiments, the patterned insulating layer 12 and other layers with openings described herein can include multiple openings or a single opening.

The patterned insulating layer 12 can be formed in a variety of ways. In an embodiment, the patterned insulating layer 12 can be an insulating coating. For example, the patterned insulating layer 12 can be a polyimide coating such as Epo-Tek 600, commercially available from Epoxy Technologies, Inc. of Billerica, Mass., USA. In other embodiments, insulating layer 12 may be formed of other materials in addition to or in place of Epo-Tek 600. The insulating coating can be applied in a variety of ways. For example, the insulating coating can be applied by printing, such as direct printing, screen printing, or the like, applied by masking and etching, or any other technique to form a patterned coating.

In some embodiments, a semiconductor device or other component(s) can be thicker than an insulating coating, in which a spacer can be positioned adjacent to and/or attached to the conductive layer 10 to accommodate the difference in thickness. For example, the spacer can be a film such as Kapton tape with an appropriate thickness. The spacer can have a thickness that is similar to a thickness of a semiconductor device or other component mounted on the conductive layer 10. In another example, the spacer can be a ceramic spacer. In various embodiments, any insulating material that can be formed with openings or attached to form openings exposing the conductive layer 10 can be used as a spacer.

In another embodiment, the patterned insulating layer 12 can include both an insulating coating and spacer. For example, the spacer can be attached to the conductive layer 10. The insulating coating can be applied to the spacer.

Figure 3:
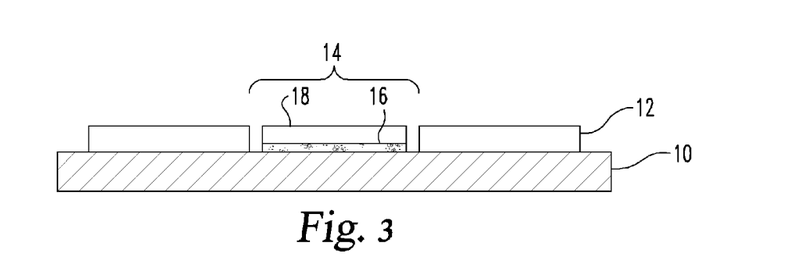

Referring to FIG. 3, additional aspects of a non-limiting example of a system in accordance with an embodiment of the present invention are schematically illustrated. In one form, a semiconductor device 18 is attached to the conductive layer 10 at a location exposed by the opening 14 in the patterned insulating layer 12. In one form, the semiconductor device 18 is be attached by a sintering process. For example, a sintering compound such as nano-silver paste can be applied to the conductive layer 10 in the opening 14 as the connection material 16. In other embodiments, semiconductor device 18 may be attached to conductive layer 10 using any suitable means.

To attach the semiconductor device 18, the semiconductor device 18 can be placed in the opening 14. The insulating layer 12 can act as an aid to placement of the semiconductor device 18. For example, the opening 14 can have an outline that is similar, but slightly larger than the semiconductor device to guide the semiconductor device 18 to a desired location. Although one semiconductor device 18 has been used as an example, multiple semiconductor devices 18 and/or other components can be placed within a single or multiple openings 14.

The structure is heated to sinter the semiconductor device 18 to the conductive layer 10. Although a sintering compound has been used as an example of a connection material 16, the semiconductor device 18 can be attached to the conductive layer 10 buy other techniques. For example, a conductive epoxy can be used as the conductive connection material 16. Accordingly, curing the conductive connection material 16 can be specific to that material and/or specific to other needs of the application. As examples of material specific curing, for one material, curing can include heating while for another material, curing can include applying a material with a curing agent.

In an embodiment, the sintering can be the only sintering process used to directly connect to a terminal of the semiconductor device 18. For example, the semiconductor device 18 can be a double sided device, such as a field effect transistor (FET) with a drain terminal on one side and a gate terminal and a source terminal on an opposite side. The drain terminal can be sintered to the conductive layer 10. However, the gate and source terminals can be contacted through other techniques, such as by wire bonding. Accordingly, sintering is not used to connect to the other terminals. Since multiple sintering processes are not used, a wider range of sintering compounds can be used. That is, a sintering compound can be selected with a temperature profile that could otherwise be degraded by a second or subsequent sintering process. In other words, additional sintering compounds with process temperatures at least 40° C. lower than previous compounds to keep the compounds from melting are not required.

Moreover, less processing time is involved as there is only one sintering process. For example a sintering process can span several hours. Each additional sintering process can add additional hours to the processing time, and must be performed at temperatures that do not adversely affect the previously sintered bonds.

Figure 4:
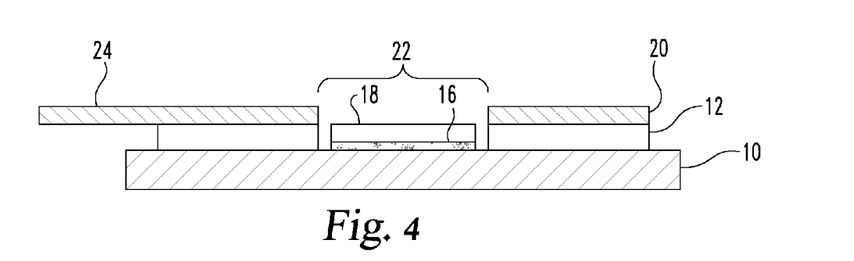

Referring to FIG. 4, additional aspects of a non-limiting example of a system in accordance with an embodiment of the present invention are schematically illustrated. In one form, a patterned second conductive layer 20 is applied over the patterned insulating layer 12. In other embodiments, a second conductive layer, patterned or not, may not be employed. In one form, the patterned second conductive layer 20 includes an opening 22 exposing the semiconductor device 18. The patterned second conductive layer 20 can include other openings in addition to any openings exposing semiconductor devices. In some embodiments, conductive layer 20 may not include an opening for semiconductor device 18.

The conductive layer 20 can be any variety of conductive material. For example the conductive layer 20 can be a copper layer similar to the conductive layer 10. However, the conductive layer 20 can be selected to have a different material, different plating, or the like.

The conductive layer 20 includes a lead 24. The lead 24 can allow electrical attachment to the conductive layer 20 from outside of the structure. As described above, the conductive layer 20 can include multiple openings. Thus, the lead 24 can, but need not be electrically connected to each portion of the conductive layer 20. Moreover, although one lead 24 is illustrated for the conductive layer 20, multiple leads 24 can be present and can be connected to the same or different portions of the conductive layer 20.

Using the example of a polyimide coating of the insulating layer 12 described above, the conductive layer 20 can be applied over the polyimide coating before the coating is cured. Curing the coating can bond the conductive layer 20 to the conductive layer 10, to a spacer, or other intervening layer. In another embodiment, an adhesive can attach the conductive layer 20 to the insulating layer 12.

Figure 5:
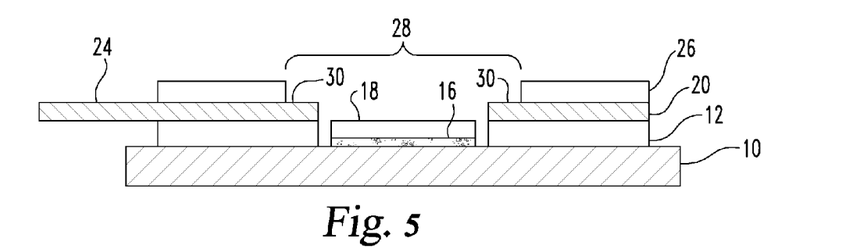

Referring to FIG. 5, additional aspects of a non-limiting example of a system in accordance with an embodiment of the present invention are schematically illustrated. In one form, a second patterned insulating layer 26 can be applied over the conductive layer 20. The second patterned insulating layer 26 can be formed similarly to the insulating layer 12; however, the insulating layer 12 and 26, or any other insulating layers need not be formed of the same materials, structure, layout, layer stack, or the like.

In one form, insulating layer 26 includes an opening 28 that exposes the semiconductor device. The opening 28 also exposes a portion 30 of the conductive layer 20. As will be described in further detail below, the portion 30 of the conductive layer 20 can be used to form electrical connections between the semiconductor device 18 and the conductive layer 20.

Figure 6:
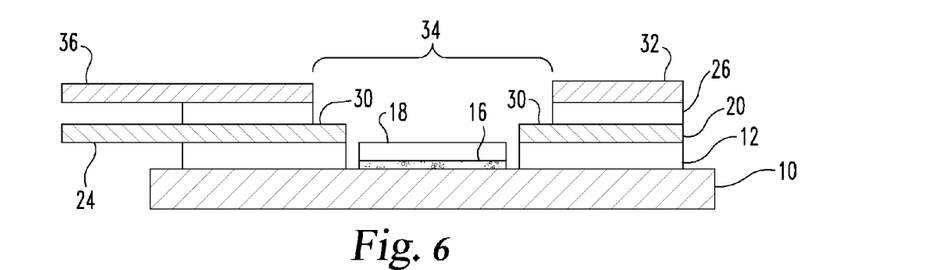

Referring to FIG. 6, additional aspects of a non-limiting example of a system in accordance with an embodiment of the present invention are schematically illustrated. In one form, a conductive layer 32 is formed over the insulating layer 26. The conductive layer 32 can be similar material, plating, or the like as the conductive layer 20. In addition, the conductive layer 32 includes leads 36 similar to leads 24; however, the leads 36 can, but need not, be disposed in substantially similar locations.

In one form, conductive layer 32 is applied to the insulation layer 26 before the insulation layer 26 is cured. Curing the insulating layer 26 can bond the conductive layer 32 to the structure. However, as described above with respect to the conductive layer 20 and insulating layer 12, the conductive layer 32 can be attached to the insulating layer 26 is other ways. For example, in other embodiments, conductive layer 32 may be applied after insulation layer 26 is cured.

Although two conductive layers 20 and 32 and insulating layers 12 and 26 have been described above, any number of conductive layers can be applied with corresponding insulating layers. In addition, each conductive layer can, but need include leads such as leads 24 and 36. For example, a conductive layer can be used for routing electrical connections wholly internal to the package. Accordingly, in some embodiments, such multiple layers can create three dimensional routing capabilities and three dimensional lead frames.

Figure 7:
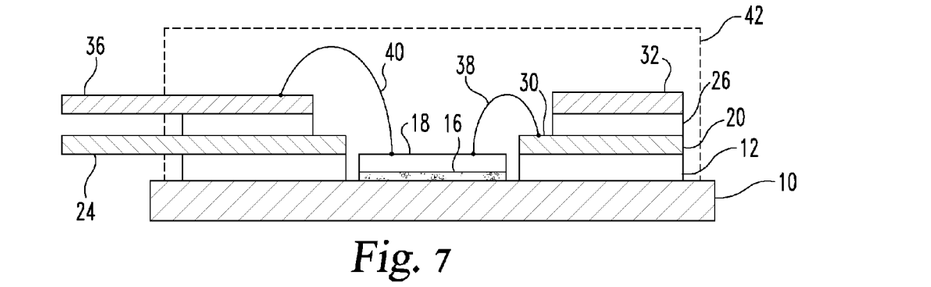

Referring to FIG. 7, additional aspects of a non-limiting example of a system in accordance with an embodiment of the present invention are schematically illustrated. In one form, bondwires 38 and 40 are formed between the semiconductor device 18 and the conductive layers 20 and 32. In particular, a bondwire can be formed between the semiconductor device 18 and the exposed portion 30 of the conducting layer 20. In this embodiment, substantially all of conductive layer 32 is exposed; however, if other layers obscure portions of the conductive layer 32, the bondwire 40 can be attached to an exposed area similar to bondwire 38. In addition, although two bondwires 38 and 40 are described, any number of connections between multiple pads of a device, multiple devices or components, or the like can be formed with bondwires.

In one form, after the bondwires are formed, the structure is encapsulated. For example, an encapsulant can be applied over the various layers and the bondwires. In one form, NuSil R-2188, available from NuSil Technology LLC of Carpinteria, Calif., USA, may be used as an encapsulate. In other embodiments, other encapsulants may be employed. In still other embodiments, one or both of leads 24 and 36 can remain exposed, forming a packaged semiconductor device.

In some embodiments, the time required to form the packaged semiconductor device is less than that required using a planar packaging technique. For example, a single sintering process, two curing processes, and an encapsulation process can be performed in forming a packaged semiconductor device in accordance with embodiments of the present invention. In contrast, a planar packaging technique for a similar electrical circuit would include three sintering processes and two curing processes. Assuming that each of these processes individually take substantially the same amount of time, packaging processes in accordance with embodiments of the present invention may include less processes, resulting in a lower total processing time.

FIG. 7 also illustrates some aspects of a non-limiting example of an embodiment of a packaged semiconductor device are schematically illustrated. Because of the various openings in the conducting layers 20 and 32, and insulating layers 12 and 26, electrical connections can be made between multiple layers. Although only bondwires between the semiconductor device 18 and conductive layers 20 and 32 are illustrated, bondwires can be formed between the conductive layers 10, 20, and 32, and between the semiconductor device 18 and the conductive layer 10 as desired. The leads 24 and 36 can form a portion of a lead frame. Although illustrated as planar, leads 24 and 26 or other similar leads can be bent, shaped, or otherwise formed as desired.

Figure 8:
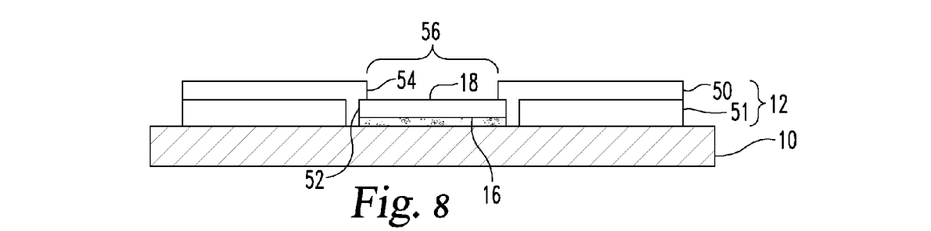
FIG. 8 is a cross sectional view illustrating some aspects of a non-limiting example of a technique of packaging a device according to an embodiment of the present invention.

FIG. 8 is a cross sectional view schematically illustrating some aspects of a non-limiting example of a technique of packaging a device according to another embodiment of the present invention. In this embodiment, a spacer 51 and insulating coating 50 form the insulating layer 12. The spacer 51 can be applied as described above with respect to FIG. 3. However, the insulating coating can be applied to cover at least an edge 52 of the semiconductor device 18. As illustrated, the insulating coating 50 extends over the edge 52. In particular, the edge 54 of the insulating coating 50 can cover guard rings of the semiconductor device 18 and fill gaps between the semiconductor device 18 and the spacer 51. The overlap of the insulating coating 50 can reduce a change of electrical breakdown around the edges of the semiconductor device 18.

Although the insulating coating 50 extends over the edge 52 op the semiconductor device 18, at least part of the semiconductor device 18 is exposed by the opening 56 in the insulating coating 50. That is, in some embodiments, an opening that exposes an underlying structure, component, device, or the like may, but need not expose the entire structure, component, device, or the like. Moreover, multiple openings can expose the same structure, component, device, or the like. Furthermore, such an opening or openings may be formed in any layer as desired.

This embodiment is another example of how various processes described herein can be interleaved. Here, the spacer 51 can be applied to the conductive layer 10. The semiconductor device 18 is sintered to the conductive layer an insulating coating 50 is applied to the spacer 51 and semiconductor device 18. The conductive layer 20 can be applied to the insulating coating 50 and the coating 50 can be cured. In other words, components of the various processes described above can be performed before any given process is complete.

Figure 9:
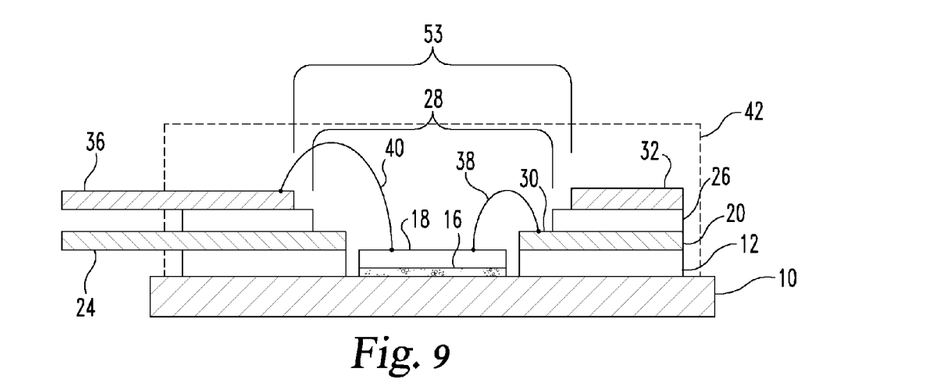
FIG. 9 is a cross sectional view illustrating some aspects of a non-limiting example of a technique of packaging a device according to an embodiment of the present invention.

FIG. 9 is a cross sectional view schematically illustrating some aspects of a non-limiting example of a technique of packaging a device according to another embodiment of the present invention. In this embodiment, the conductive layer 32 includes an opening 53. The opening 53 is larger than a corresponding opening 28 of the insulating layer 26. Accordingly, a portion of the insulating layer 26 is exposed by the opening 53. Although the conductive layer 32 and insulating layer 26 have been used as examples, opening of other layers can be offset from one another.

Figure 10:
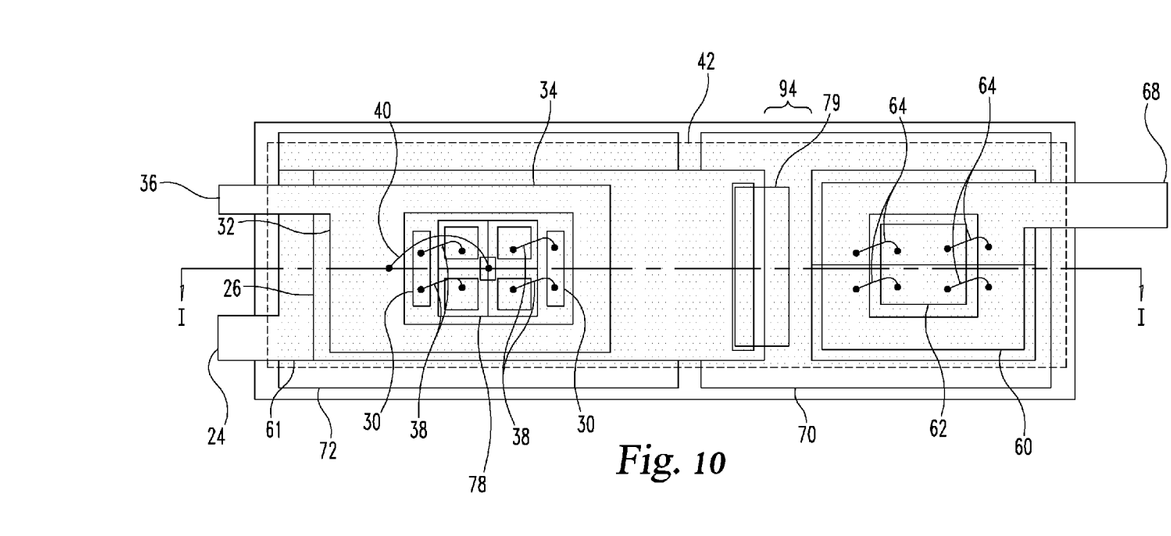
FIG. 10 is a plan view illustrating some aspects of a non-limiting example of a packaged semiconductor device according to an embodiment of the present invention.
Figure 11:
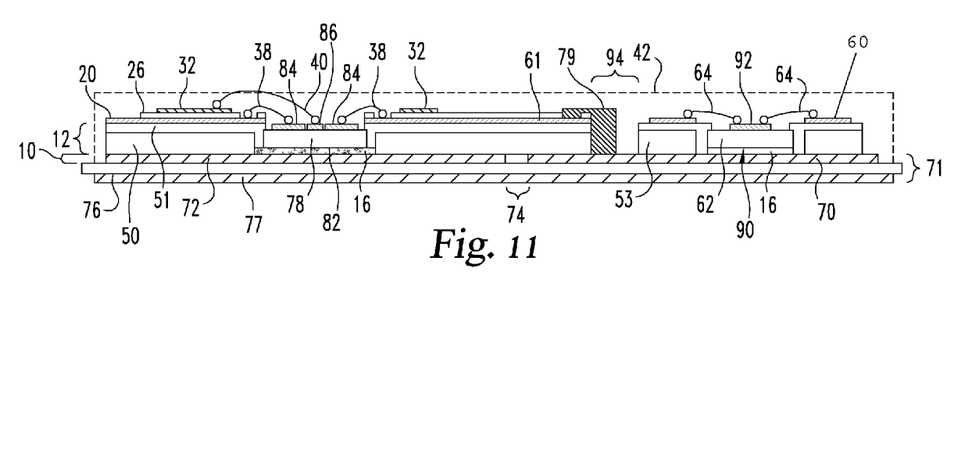
FIG. 11 is a cross-sectional view of the packaged semiconductor device of FIG. 10.

FIG. 10 is a plan view schematically illustrating some aspects of a non-limiting example of a semiconductor device according to another embodiment of the present invention. FIG. 11 is a cross-sectional view of the packaged semiconductor device of FIG. 10 along axis I. FIGS. 10 and 11 illustrate various forms of conductive layers, connections between conductive layers, and multiple semiconductor devices.

A DBC substrate 71 includes a conductive layer 10, and insulating layer 76, and a conductive layer 77. The conductive layer 10 is divided by a gap 74 into two electrically isolated portions 72 and 70. In this embodiment, the semiconductor device 78 is an FET with a bottom side drain contact 82 and top side source 84 and gate 86 contacts. The drain 82 is sintered to portion 72 of the conductive layer 10. Semiconductor device 62 is a diode with a cathode contact 90 and an anode contact 92. The cathode 90 is sintered to portion 70 of the conductive layer 10.

As illustrated, both portions 70 and 72 of the conductive layer 10 are exposed by the encapsulation layer 42. Accordingly, electrical connections can be made to the portions 70 and 72, and hence, to the transistor 78 and diode 62. However, the conductive layer 10 can include portions that are not exposed by the encapsulation layer 42.

In one form, insulating layer 12 includes spacers 50 and an insulating coating 51. The insulating layer 12 is disposed over the conductive layer 10. A first spacer 50 includes an opening that exposes the semiconductor device 78. A second spacer 53 includes an opening that exposes the semiconductor device 62. Although two spacers 50 and 53 have been described, the spacers 50 and 53 can be formed with a single patterned spacer. Alternatively, other spacers can be used for other semiconductor devices or components. Various insulating layers and conductive layers can span the multiple spacers to allow routing between the devices and components within the spacers.

In one form, conductive layer 20 includes portions 60 and 61. Portion 61 includes a lead 24. Portion 60 includes a lead 68. Another insulating layer 26 and conductive layer 32 are disposed over the conductive layer 20. Any number of insulating layers and conductive layers can be stacked as desired. Moreover, any conductive layer can have a corresponding lead or leads allowing electrical connections to that layer or a portion of the layer.

Bondwires 38 couple the source contacts 84 to the conductive portion 61. Similarly, bondwires 40 couple the gate contact to the conductive layer 36. In addition, bondwires 64 couple the anode 92 to the conductive portion 60.

A conductive structure 79 couples the conductive portion 61 to the conductive portion 70. In this embodiment, the conductive structure is a solder joint; however, the conductive structure can take other forms such as one or more bondwires, conductive epoxy, or the like. The conductive structure 79 can make a connection to the conductive portion 70 through the opening 94. That is, the insulating layer 12 and conductive layer 20 are formed with the opening 94 exposing the portion 70 of the conductive layer 10.

Accordingly, the cathode 90 of the diode 62 is electrically connected to the source 84 of the transistor 82. Although a particular circuit is illustrated, i.e. a transistor and diode, other circuits and connections, e.g., using the other devices in addition to or in place of the transistor and/or diode, can be made as desired using the various conductive layers, bondwires, conductive structures, additional or different semiconductor devices and components, or the like.

In some embodiments, an improved packaged semiconductor device can be formed. In particular, improved performance relative to a planar packaging scheme and an ease of packaging of a wire-bonded package can be combined. The hybrid packaging technique can use bottom side sintering as in a planar structure but also uses top-side wirebonding. Accordingly, double-side solderable devices, i.e. devices that allow for top-side sintering need not be used. The resulting packaged device can have the smaller footprint and lower parasitic effects of a planar package, but the ease of manufacturing of a wire-bonded device.

Although the above described packaged devices and techniques of packaging can be used for a variety of semiconductor devices, in one example, this packaging technique can be used for high temperature power electronics devices, such as silicon carbide and gallium nitride devices, which may operate at temperatures as high as 250° C. or higher.

Moreover, in some embodiments, a smaller footprint and lower parasitic effects can be achieved relative to a wire-bonded packaged device. For example, in comparison to a wire-bonded device, routing between devices can be achieved using routes on multiple layers. As described above, bondwires can create electrical connections between top-side contacts of a device and conductive layers over the conductive layer of the DBC substrate. If terminals of multiple devices are on the respective top-sides of the devices, connections between the devices can be made within a single conductive layer, such as the conductive layer 20.

That is, the conductive layer 20 can be coupled to the top-side pads through shorter bondwires. A bondwire from the top-side pad can extend in a substantially planar route. In other words, the bondwire need not have additional length to account for the height of a semiconductor device 78, a gap to create another node, and a shape or arced to sufficiently clear the semiconductor device 78. Thus, the shorter bondwire results in reduced parasitic effects.

Although single layers, such as single conductive and single insulating layers, are described below, such single layers can be formed of multiple, substantially similar layers. For example, a conductive layer can be a first metal layer plated by a second metal. In another example, an insulating spacer and an insulating coating can form a single insulating layer.

Moreover, a first layer can be described as being over a second layer. Such a first layer can, but need not be in direct contact with the second layer. In addition, the first and second layers can, but need not be coincident. For example, a first layer can be over a second layer, yet components of the two layers are offset from one another.

Although layers have been described above as being substantially planar, a layer can be a non-planar structure. For example, an insulating coating can be applied over a non-planar structure, resulting in a non-planar insulating coating; however, the insulating coating can still be referred to as a layer.

Although particular layers have been described above, other layers can be applied, whether temporarily or permanently. For example, adhesive layers can bond various layers described above together. In another example, mask layers can be used in patterning processes.

Although various layers have been described as patterned, the layers can, but need not be patterned in place. For example, the conductive layer 10 can be patterned in place on a DBC substrate. In another example, a conductive layer 20 can be patterned before applying the conductive layer 20 to an insulating layer 12.

Embodiments of the present invention include a method, comprising: applying a patterned insulating layer to a first conductive layer, the patterned insulating layer including an opening exposing the first conductive layer; attaching a semiconductor device to the first conductive layer at a location exposed by the opening; applying a patterned second conductive layer over the patterned insulating layer, the patterned second conductive layer including an opening exposing the semiconductor device; and forming a bondwire from the semiconductor device to the second conductive layer.

In a refinement, the applying the patterned insulating layer comprises: attaching a spacer to the first conductive layer; and applying an insulating coating to the spacer.

In another refinement, the attaching the semiconductor device comprises attaching the semiconductor device before applying the insulating coating to the spacer.

In yet another refinement, applying the patterned insulating layer comprises applying the patterned insulating layer over an edge of the semiconductor device.

In still another refinement, the attaching the semiconductor device comprises: applying a conductive connection material between the semiconductor device and the first conductive layer; and curing the conductive connection material.

In yet still another refinement, the curing of the conductive connection material is sintering of the conductive connection material; and the sintering of the conductive connection material is the only sintering process used to directly connect to a terminal of the semiconductor device.

In a further refinement, applying a patterned insulating layer and applying the patterned second conductive layer comprise: applying an insulating coating over the first conductive layer; applying the patterned second conductive layer over the insulating coating; and curing the insulating coating.

In a yet further refinement, the patterned insulating layer referred to as a first patterned insulating layer, the method further comprising: applying a second patterned insulating layer over the second conductive layer; applying a third conductive layer over the second patterned insulating layer; and forming a bondwire from the semiconductor device to the third conductive layer.

In a still further refinement, the second patterned insulating layer includes an opening exposing the second conductive layer.

In a yet still further refinement, the third conductive layer includes an opening exposing the opening of the second patterned insulating layer.

In an additional refinement, the method further comprises encapsulating the semiconductor device after forming the bondwire.

In another additional refinement, the semiconductor device referred to as a first semiconductor device, wherein: applying the patterned insulating layer includes applying the patterned insulating layer having a second opening exposing the first conductive layer; and attaching a second semiconductor device to the first conductive layer at a location exposed by the second opening.

In yet another additional refinement, the first conductive layer comprises: a first conductive portion; and a second conductive portion separated from the first conductive portion by a gap; wherein: the first semiconductor device is attached to the first conductive portion; and the second semiconductor device is attached to the second conductive portion.

In still another additional refinement, the method further comprises electrically connecting a portion of the second conductive layer over the first conductive portion to the second conductive portion.

Embodiments of the present invention include a packaged device, comprising: a first conductive layer; a semiconductor device attached to the first conductive layer; a first insulating layer over the first conductive layer, the first insulating layer including an opening exposing the semiconductor device; a second conductive layer over the first insulating layer, the second conductive layer including an opening exposing the semiconductor device; a second insulating layer over the second conductive layer, the second insulating layer including an opening exposing the semiconductor device; a third conductive layer over the second insulating layer, the third conductive layer including an opening exposing the semiconductor device; a first bondwire coupled between the semiconductor device and the second conductive layer; and a second bondwire coupled between the semiconductor device and the third conductive layer.

In a refinement, the first insulating layer is substantially adjacent to the semiconductor device.

In another refinement, the first insulating layer extends over an edge of the semiconductor device.

In yet another refinement, the second insulating layer includes an opening that exposes at least a part of the second conductive layer.

In still another refinement, the first bondwire is coupled between the semiconductor device and the at least a part of the second conductive layer exposed by the opening of the second insulating layer.

In yet still another refinement, the packaged device further comprises an encapsulation layer over the semiconductor device and the first and second bondwires.

In a further refinement, the packaged device further comprises a lead frame including at least a portion of the second conductive layer and at least a portion third conductive layer.

Embodiments of the present invention include a packaged device, comprising: a first conductive layer; a first semiconductor device attached to the first conductive layer; a second semiconductor device attached to the first conductive layer; a first insulating layer formed over the first conductive layer, the first insulating layer including a first opening exposing the first semiconductor device and a second opening exposing the second semiconductor device; a second conductive layer formed over the first insulating layer, the second conductive layer including a first opening exposing the first semiconductor device and a second opening exposing the second semiconductor device; a first bondwire coupled between the first semiconductor device and the second conductive layer; and a second bondwire coupled between the second semiconductor device and the second conductive layer.

In a refinement, a first section of the first conductive layer is attached to the first semiconductor device; a second section of the first conductive layer is attached to the second semiconductor device; and the first section is separated from the second section by a gap.

In another refinement, the first opening of the second conductive layer and the second opening the second conductive layer are separate.

In yet another refinement, the first conductive layer comprises: a first conductive portion; and a second conductive portion separated from the first conductive portion by a gap; wherein: the first semiconductor device is attached to the first conductive portion; and the second semiconductor device is attached to the second conductive portion.

While the invention has been described in connection with what is presently considered to be the most practical and preferred embodiment, it is to be understood that the invention is not to be limited to the disclosed embodiment(s), but on the contrary, is intended to cover various modifications and equivalent arrangements included within the spirit and scope of the appended claims, which scope is to be accorded the broadest interpretation so as to encompass all such modifications and equivalent structures as permitted under the law. Furthermore it should be understood that while the use of the word preferable, preferably, or preferred in the description above indicates that feature so described may be more desirable, it nonetheless may not be necessary and any embodiment lacking the same may be contemplated as within the scope of the invention, that scope being defined by the claims that follow. In reading the claims it is intended that when words such as "a," "an," "at least one" and "at least a portion" are used, there is no intention to limit the claim to only one item unless specifically stated to the contrary in the claim. Further, when the language "at least a portion" and/or "a portion" is used the item may include a portion and/or the entire item unless specifically stated to the contrary.

The invention claimed is:

1. A packaged device, comprising:
a first conductive layer;
a semiconductor device attached to the first conductive layer;
a first insulating layer over the first conductive layer, the first insulating layer including an opening exposing the semiconductor device;
a second conductive layer over the first insulating layer, the second conductive layer including an opening exposing the semiconductor device;
a second insulating layer over the second conductive layer, the second insulating layer including an opening exposing the semiconductor device;
a third conductive layer over the second insulating layer, the third conductive layer including an opening exposing the semiconductor device;
a first bondwire coupled between the semiconductor device and the second conductive layer;
a second bondwire coupled between the semiconductor device and the third conductive layer; and
wherein the first insulating layer is substantially adjacent to the semiconductor device.

2. The packaged device of claim 1, wherein the first insulating layer extends over an edge of the semiconductor device.

3. The packaged device of claim 1, wherein the second insulating layer includes an opening that exposes at least a part of the second conductive layer.

4. The packaged device of claim 3, wherein the first bondwire is coupled between the semiconductor device and the at least a part of the second conductive layer exposed by the opening of the second insulating layer.

5. The packaged device of claim 1, further comprising an encapsulation layer over the semiconductor device and the first and second bondwires.

6. The packaged device of claim 1, further comprising a lead frame including at least a portion of the second conductive layer and at least a portion third conductive layer.

7. A packaged device, comprising:
a first conductive layer;
a first semiconductor device attached to the first conductive layer;
a second semiconductor device attached to the first conductive layer;
a first insulating layer formed over the first conductive layer, the first insulating layer including a first opening exposing the first semiconductor device and a second opening exposing the second semiconductor device;
a second conductive layer formed over the first insulating layer, the second conductive layer including a first opening exposing the first semiconductor device and a second opening exposing the second semiconductor device;
a first bondwire coupled between the first semiconductor device and the second conductive layer;
a second bondwire coupled between the second semiconductor device and the second conductive layer; and
wherein the first insulating layer is substantially adjacent to the first and the second semiconductor devices.

8. The packaged device of claim 7, wherein
a first section of the first conductive layer is attached to the first semiconductor device;
a second section of the first conductive layer is attached to the second semiconductor device; and
the first section is separated from the second section by a gap.

9. The packaged device of claim 7, wherein the first opening of the second conductive layer and the second opening the second conductive layer are separate.

10. The packaged device of claim 7, wherein the first conductive layer comprises:
a first conductive portion; and
a second conductive portion separated from the first conductive portion by a gap;
wherein:
the first semiconductor device is attached to the first conductive portion; and
the second semiconductor device is attached to the second conductive portion.

* * * * *